(12) United States Patent
Barcomb et al.

(10) Patent No.: US 6,931,580 B1
(45) Date of Patent: Aug. 16, 2005

(54) RAPID FAIL ANALYSIS OF EMBEDDED OBJECTS

(75) Inventors: Kevin J. Barcomb, Burlington, VT (US); Leendert M. Huisman, South Burlington, VT (US); Mark F. Olive, Milton, VT (US); Kevin C. Quandt, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/524,254

(22) Filed: Mar. 13, 2000

(51) Int. Cl.[7] ............................................. G06F 11/00
(52) U.S. Cl. ..................... 714/742; 714/733; 382/149
(58) Field of Search ............................... 714/742, 723, 714/25, 725, 733, 727, 734; 382/149

(56) References Cited

U.S. PATENT DOCUMENTS

| | | |
|---|---|---|
| 3,961,252 A | 6/1976 | Eichelberger |
| 4,460,999 A | 7/1984 | Schmidt |
| 4,479,214 A | 10/1984 | Ryan |
| 5,164,666 A | 11/1992 | Wolfgang et al. |
| 5,240,866 A | 8/1993 | Friedman et al. |
| 5,256,578 A | 10/1993 | Corley et al. |
| 5,325,309 A | 6/1994 | Halaviati et al. |
| 5,430,734 A | 7/1995 | Gilson |
| 5,544,308 A | 8/1996 | Giordano et al. |
| 5,561,293 A | 10/1996 | Peng et al. |
| 5,787,190 A | 7/1998 | Peng et al. |
| 5,828,825 A | 10/1998 | Eskandari et al. |
| 5,831,992 A | 11/1998 | Wu |
| 5,838,951 A | 11/1998 | Song |
| 6,128,403 A * | 10/2000 | Ozaki |
| 6,785,413 B1 * | 8/2004 | Barcomb et al. ........... 382/149 |

OTHER PUBLICATIONS

Lallier, K.W., et al., "Relating Logic Design To Physical Geometry In LSI Chip", *IBM® Technical Disclosure Bulletin*, vol. 19, No. 6, Nov. 1976, pp. 2140-2143.

* cited by examiner

*Primary Examiner*—Phung My Chung
(74) *Attorney, Agent, or Firm*—Connolly Bove Lodge & Hutz LLP; Myron K. Wyche; Robert Walsh, Esq.

(57) ABSTRACT

A method for analyzing test data for objects on an IC or a wafer is provided. The test data is linked to available layout information about the object under test. Certain objects are selected based on the test data. A representation of the selected objects is placed on a map of the IC or on a map of the wafer. The representation should correspond to the physical location of the object on the IC or wafer. Preferably, the representation comprises one or more polygons that enclose all devices that make up the object.

26 Claims, 4 Drawing Sheets

46 ↓

| TYPE | COUNT |
|---|---|
| CHIP | ▨▨▨▨▨▨▨▨▨▨ 130 |
| L2DIR5 | ▨ 20 |
| L2DIR1 | ▨ 19 |
| L2DIR4 | ▨ 18 |
| L2DIR6 | ▨ 18 |
| L2DIR0 | ▨ 16 |
| L2DIR7 | ▨ 15 |
| L2DIR2 | ▨ 15 |
| DC0 | ▨ 13 |
| DC7 | ▨ 12 |
| L2DIR3 | ▨ 9 |
| IC0 | ▨ 8 |
| DC6 | ▨ 8 |
| IC1 | ▨ 8 |
| SNPDIR7 | ▨ 7 |
| DC1 | ▨ 7 |
| ITDIR | ▨ 7 |
| IC4 | ▨ 7 |
| SNPDIR5 | ▌ 6 |
| IC7 | ▌ 6 |
| CLASSP | ▌ 6 |
| SNPDIR4 | ▌ 5 |
| SNPDIR6 | ▌ 5 |
| DC2 | ▌ 5 |
| ERAT | ▌ 5 |
| DC4 | ▌ 5 |
| IC2 | ▌ 5 |
| DTDIR | ▌ 5 |
| ICLASSP | ▌ 4 |
| TLB1 | ▌ 4 |
| TLB2 | ▌ 4 |
| TLB3 | ▌ 4 |
| IC6 | ▌ 4 |
| SNPDIR1 | ▌ 4 |
| SNPDIR3 | ▌ 4 |
| DC3 | ▌ 4 |
| IC5 | ▌ 4 |
| IC3 | ▌ 4 |

FIG. 3B

RAPID FAIL ANALYSIS OF EMBEDDED OBJECTS

FIELD OF THE INVENTION

The present invention relates to a method for fail analysis of objects in integrated circuits and semiconductor wafers, and, more particularly, to a method for rapid fail analysis which links the fail data to layout information available about the device under test such that the physical location of a failing object is determined and may be visually plotted.

BACKGROUND OF THE INVENTION

The manufacture of integrated circuits (ICs) on semiconductor wafers is a complex process and involves many different steps. Failure to correctly perform one or more of the steps on one or more wafers in a batch will likely cause the circuits on a wafer to fail. Sometimes, random circuit failures occur. Generally, there is little that can be done to avoid random failures. Moreover, random failures do not provide much information on the manufacturing process that can be used to enhance manufacturing yield.

However, failures are often distributed in a pattern as a result of one or more process steps being improperly carried out. These non-random failure patterns can serve as a guide to provide valuable information as to the sources of the failures. Thus, one of the goals of fail analysis is to get inventories of what objects on an IC actually failed along with the display, presentation, and analysis of those inventories. This information makes it possible to make a rapid identification of common failures, chip and wafer scale patterns of failures, as well as, if possible, an identification of the actual defect that caused the failures.

Fail analysis is done after manufacturing tests are performed on the IC and test data are obtained. Traditionally, fail analysis has been done only at two levels. At a first level of fail analysis, sort codes are assigned to the integrated circuits. The sort codes tell if the integrated circuit passed all the tests, or, if not, during which phase of the test the IC failed. The integrated circuits are then sorted, based on their quality, usually into two grade levels: good and reject. At the first test level, very little detail is available about what actually failed on the IC, and very little usable information is extracted from the fail data, other than the phase of the test at which the failure occurred. Consequently a second level of testing and analysis is sometimes necessary. At the second test level, detailed information is obtained, such as the generation of detailed bit maps of memory chips. These bit maps show which bits contained incorrect values at any phase of the memory test. The second level provides very detailed information, however, at the cost of an extended test session, in addition to the normal manufacturing test session, to extract the bit map data. Moreover, such a detailed analysis seems to be applicable only to memory devices.

Large volumes of wafers are manufactured every day and it is impractical to perform a detailed bit analysis of each failed object on a wafer. Therefore, in practice, only a few failed IC's are bit mapped. It is currently a manual process to choose which failing IC's to bit map by manually going through the fail data. Consequently, it is difficult to pick the failed IC's that are representative of the largest yield detractors.

U.S. Pat. No. 5,838,951 to Song describes a common method of forming a wafer map. After testing the dies or chips on the wafer, the dies are sorted into various grade levels and the positions of the dies on the wafer are recorded. The various grades of the dies on the wafer are then displayed. However, the '951 patent does not identify which objects on the dies failed or which particular device forming an object may have caused the fault.

Consequently, it is difficult to see wafer level problem areas when it is desired to select a particular failing object, such as an embedded array, to bit map. Thus, there is a need for a visual tool which gives a wafer level view of all failing objects.

SUMMARY OF THE INVENTION

A method for analyzing test data for objects on an IC or a wafer is provided. The test data is linked to available layout information about the object under test. Certain objects are selected based on the test data. A representation of the selected objects is placed on a map of the IC or on a map of the wafer. The representation should correspond to the physical location of the object on the IC or wafer. Preferably, the representation comprises one or more polygons that enclose all devices that make up the object.

DESCRIPTION OF THE DRAWINGS

The present invention will now be further describe in the following pages of specification when taken in conjunction with the attached drawings, in which.

DETAILED DESCRIPTION OF THE INVENTION

Figure 1:
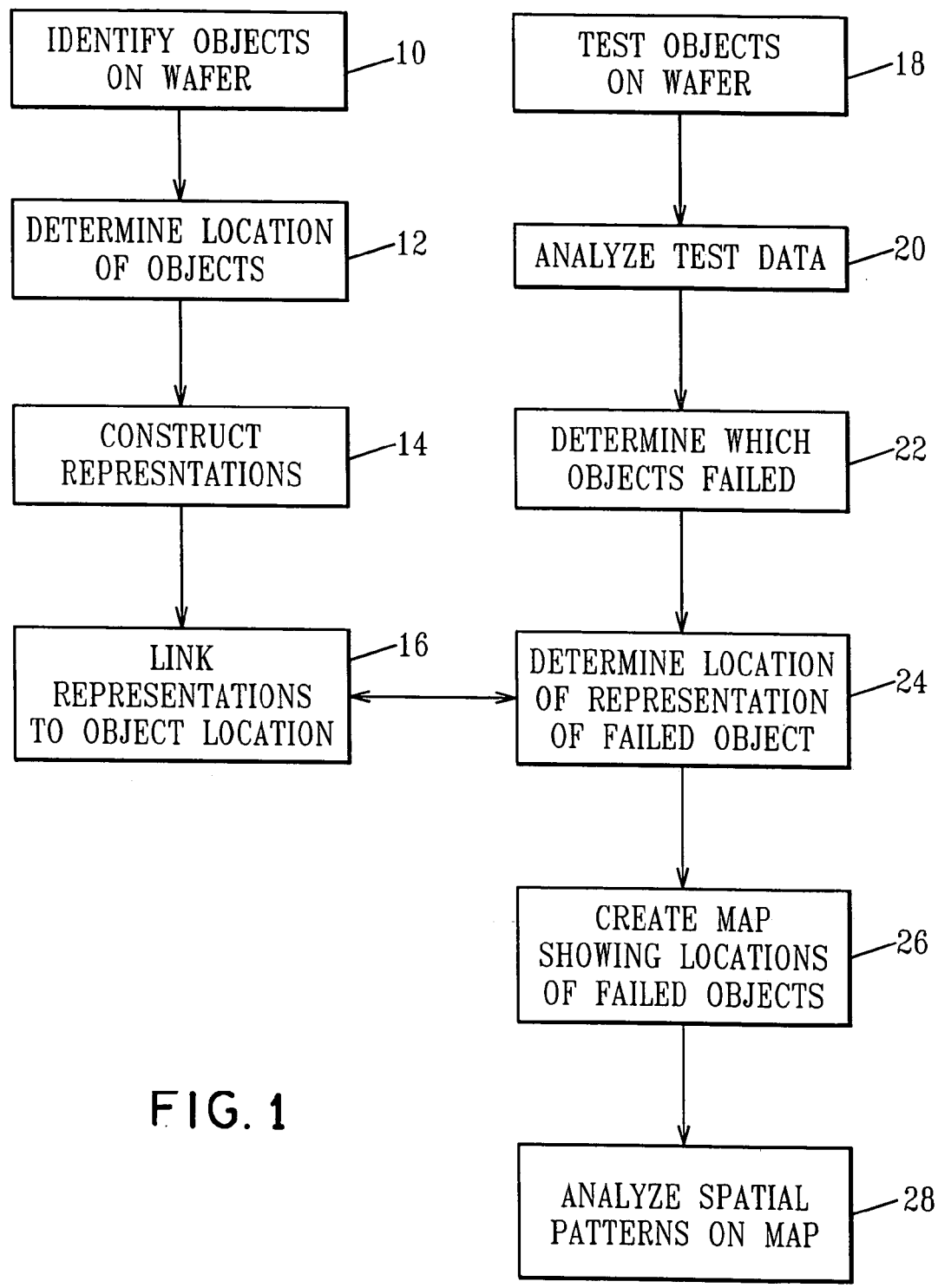
FIG. 1 is a process flow according to an embodiment of the invention.

The present invention provides a method for analyzing test data of an embedded object. For purposes of this invention, an embedded object is a set of electronic devices, like transistors and nets, that make up a structure with a recognizable function. Examples are embedded memory arrays, scan chains, macros, cores, etc. The object is embedded in the sense that it is surrounded by other circuitry on the chip, such that it is not directly accessible from the input and output terminals or pads of the chip. As a result, testing an embedded memory array, as well as other embedded objects, is difficult.

The invention is preferably used in conjunction with an initial level of testing. As described above, at this initial or first level, sort codes are assigned to the IC's that describe if the IC passed all the tests, or, if not, during which phase of the test the IC failed. For many embedded objects, the test sequence for the IC explicitly tests whether or not that object is operational, and the resulting fail data contain the information needed to tell whether that object passed its associated test. Examples of first level tests are scan tests that determine whether each scan chain on the IC actually operates correctly as a scan chain and embedded memory array tests that determine whether embedded memory arrays are defect free. These and other types of first level tests, or manufacturing tests, are well known to one skilled in the art and will not be described in detail here.

The method of the present invention extracts the maximal amount of information from the manufacturing test data. In other words, it can be used in conjunction with know manufacturing tests already being used today. However, the invention uses far more information than just what phase of the test caused the object to fail and provides far more information in return. This is accomplished by linking the fail data obtained from the manufacturing testing to available layout information about the object under test. Of course, the same techniques may also be applied when additional test sessions have produced additional fail data.

The present invention preferably shows the failure of an embedded object by placing a representation of that object on a map of the failing IC or on a map of the wafer that contains the failing IC. Ideally all failing objects are represented on the map. The representation should comprise one or more polygons that enclose all the devices that make up the embedded object. In the case of a memory array, the polygon may simply be a rectangle that encloses the bit cells, the sense amplifiers and pre-charge logic, and the address and decode logic. The polygons should be placed in their correct locations on the map of the IC or the wafer. That is, the polygons should be placed such that they would enclose the devices that make up the embedded object if those objects had, instead, been shown on the map of the IC or the wafer. This map may be an actual visual map or a set of coordinates from which a visual map could be produced.

Consequently, the present invention provides a much more detailed view of what actually failed on an IC or on a wafer, and makes much more extensive use of the existing fail data than the prior art. By using polygons rather than the actual shapes that make up the devices in the failed embedded object, it is ensured that the maps can be produced rapidly. Additionally, this allows a visual map to be plotted rapidly using existing wafer map software, such as Plyview™, if required.

Figure 3A:
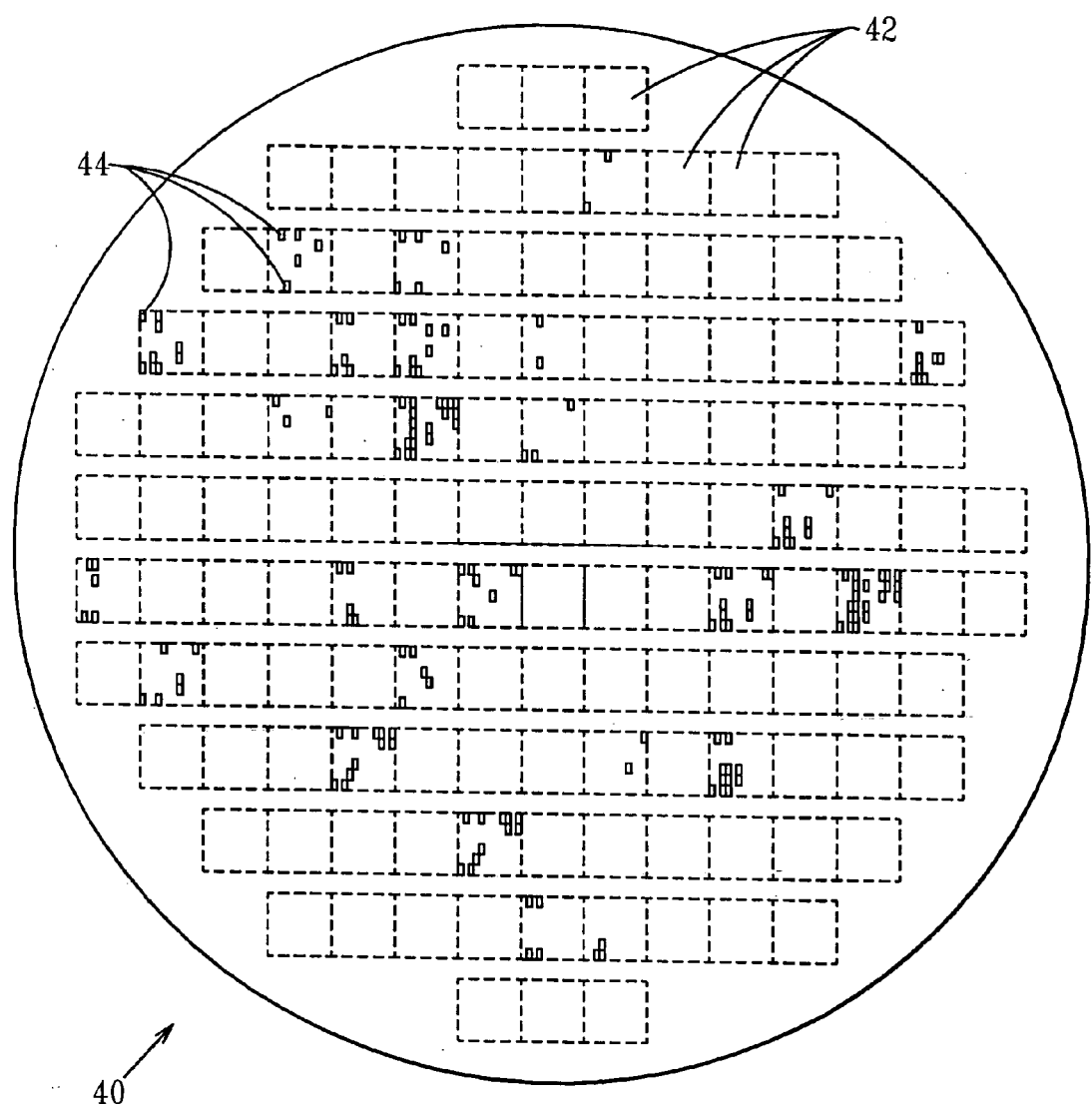
FIG. 3 is a wafer map produced according to the invention.

Turning for a moment to FIG. 3, a map of a wafer 40, to which the method of the present invention may be applied, is illustrated. The semiconductor wafer 40 is divided into a number of dies 42 on which integrated circuits may be formed. The integrated circuits may include a number of embedded objects, and the embedded objects may be made up of a number of devices. For example, the embedded objects included in the integrated circuit may comprise phase-locked loops, programmable logic arrays, content addressable memories, a core, a macro, or a scan chain, among others. The embedded objects may also include embedded memory arrays, such as cache memory which may be an embedded SRAM or DRAM or non-volatile memory. If the embedded object is a memory array, the devices comprising the embedded object may include bit cells, sense amplifiers, pre-charge logic, and the address and decode logic, as described above. The embedded objects and devices will be formed at various locations on the semiconductor wafer depending upon the circuits being fabricated.

Initially, according to an embodiment of the invention, it should be determined which of the embedded objects on the semiconductor wafer are to be tested, as show in step 10 of FIG. 1. The objects selected should include those embedded objects which can fail and for which pass/fail information can be collected. The particular types of embedded objects selected will vary depending on the kind of chips being manufactured. According to step 12 the locations of the embedded objects on the wafer or IC is obtained. This information can be obtained from the physical layout design data of the chip. Also in this step, the locations on the wafer or IC of the constituent devices making up the embedded object may be determined. Preferably, this step includes determining the dimensions, shape, orientation and location of the embedded objects on the wafer or IC. Next, per step 14, representations for the embedded objects are created.

The representations may include a set of polygons that enclose all of the devices making up the embedded objects. Each embedded object being tested should be enclosed by its own polygons. In the case where the embedded object is a memory array, as described above, the polygon may be a simple rectangle that encloses the bit cells, the sense amplifiers, pre-charge logic, and the address and decode logic which make up the memory array. The embedded objects are then linked to the locations of their associated sets of polygons, according to step 16. This step should be carried out with reference to the information provided by step 12. Thus the linking can be accomplished by building a cross-reference map of the locations of the embedded objects on the wafer, from step 12, and their associated sets of polygons.

Turning now to step 18, the integrated circuits are tested. The test may be any of a number of known tests, for example, on LSSD scan test known to one skilled in the art. The test data output by the test is then analyzed to determine which object failed on which integrated circuit, per steps 20–22. These steps may include analyzing the test data to determine that a portion of an embedded object or device making up an embedded object failed and, from that determination, determining which of the embedded objects failed.

After the test is performed, the interpreted test data, including which embedded objects failed the test, is combined with the location of each embedded object. This enables the physical location of the failing objects on the IC or wafer to be established, per step 24. Preferably, this is accomplished by referring to the cross-reference map. On that map, the locations of the failed embedded objects on the wafer or IC are linked to their respective representative polygons. From this information the physical location of the failed objects can be determined. Next, according to step 26, an IC map or wafer map of the failing objects is generated. The map should physically plot the location and shape of each of the failed objects. This is done by placing a representation, i.e., the polygon, of the failed object on the map. The polygons are preferably arranged on the wafer map in the exact locations of the embedded objects they represent. That is, the polygons are placed such that they would enclose the devices making up their respective embedded object if those embedded objects had been, instead, shown on the wafer map. The wafer map can be an actual visual map, or a set of coordinates from which a visual map may be produced. As mentioned above, a visual map may be plotted rapidly using existing wafer map software, such as Plyview™, if required.

FIG. 3 shows a wafer map, which has been plotted using the data generated by the method of the present invention and Plyview™. A semiconductor wafer 40 has a plurality of die or ICs 42 fabricated on an upper surface. Representations 44, i.e. polygons, of the embedded objects on the wafer are shown on the map. The representations physically plot all the failing embedded objects on the wafer in exact location and shape. Here the analysis was done of embedded memory arrays and the polygons are rectangles, as described above. Several different types of embedded objects may be shown on the wafer map. These different objects may be distinguished be different shapes or colors of the polygons correspond to different objects. A key 46 is preferably provided for easy reference.

The map of FIG. 3 does not contain the detail that a full bit map contains. However, the map shows enough information to discern spatial patterns, wafer scale correlations between fails and anomalous fail correlations between different memories, etc. whenever such correlations occur. As easily seen from the map of FIG. 3, the clusters or patterns of failed objects are easily ascertained. Thus, which objects should be selected for a more detailed analysis is more readily apparent. Additionally, as the polygons are placed on their correct locations on the IC, it is now possible to determine whether certain areas of the IC or wafer are more prone to failure than others. Stacking a number of these wafer maps on top of each other to find a pattern of failures on the wafers on a batch can accomplish this. This analysis can be done with a computer, step 28.

Figure 2:
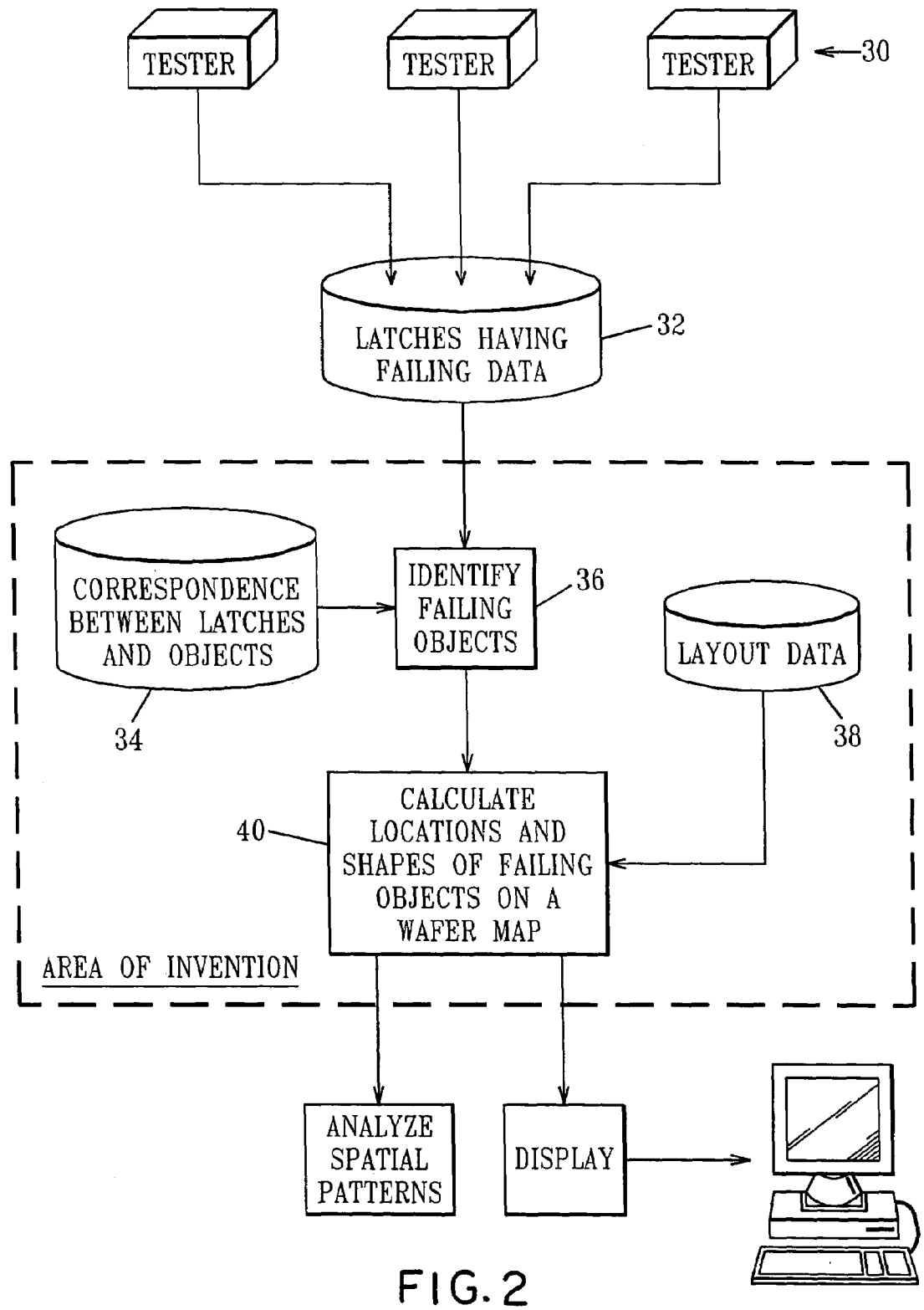
FIG. 2 is another process flow of an embodiment of the invention.

FIG. 2 is a flow diagram of the method of the invention when scan chains are used to test the IC. One or more scan chains apply known stimulus (test) data to the functional circuitry of the IC. The data resulting from one or more normal operating cycles of the IC is then observed. Some ICs include a scan chain comprising a set of latches interposed between the input and output pads and the I/O pads of the functional circuitry. The latches are configured as serial shift registers for scanning. The latches that contain data resulting from the test that does not match the expected result are failing latches. As shown by steps 30–32, the IC is tested and latches with failing data are determined.

Next, the embedded objects, which caused the test results to be incorrect, are identified. This can be done referring to the correspondence between the objects and the failing latches, steps 34–36. In know scan tests, the test data applied to the IC is selected with reference to the function of the circuit. Thus, when a part of the test data is incorrect, a corresponding embedded object which failed may be identified. Preferably a one to one correspondence between an object and one or more failing latches in the test data is provided.

Per steps 38–40, the layout data of the IC is referred to calculate the locations and shapes of the failing objects. A cross-reference map as described above may be used for this purpose. The locations and shapes of the failing objects are then plotted on a wafer map. The wafer map, or several wafer maps may then be displayed and analyzed to detect fault patterns and possible causes of the faults, per steps 42–44. Once identified, the difficulties with particular process steps or in forming arrays on parts of the wafer can be identified and remedied, improving yield.

The present invention provides a much more detailed view of what actually failed on an IC or on a wafer and makes much more extensive use of the fail data obtained during the manufacturing test. The use of polygons rather than the shapes that make up the devices in the failed embedded object ensures that the fail maps can be produced rapidly and, if a visual map is required, be plotted rapidly using existing wafer map software such as Plyview™. Additionally, the present invention fills a gap when, for example, embedded memories fail but no bit map can be generated economically.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described herein above are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of mapping test results for objects on a semiconductor wafer comprising:
    a) performing a first level test;
    b) selecting failed objects based on the test results;
    c) placing representations of the selected failed objects on a visual map according to the selected objects' positions on the wafer.

2. The method of claim 1 wherein step b) comprises:
    determining locations of each the objects;
    creating representations enclosing the objects;
    building a cross-reference map linking the test results to the locations of the representations; and
    referring to the cross-reference map when placing the representations on the map.

3. The method of claim 1 wherein the representations are polygons enclosing all devices which make up the selected object.

4. The method of claim 1 wherein the map is a wafer map.

5. The method of claim 1 wherein the map is a map of an IC.

6. The method of claim 1 wherein the map is a set of coordinates.

7. The method of claim 1, wherein step b) comprises:
    physically plotting the location and shape of the failed objects on the visual map of the wafer.

8. A method for determining the physical locations of failed objects on an integrate circuit comprising:
    a) identifying objects on the integrated circuit, which are to be tested;
    b) determining a location of each of the objects;
    c) providing test data resulting from a test of the integrated circuit;
    d) selected failed objects based on the test data; and
    e) linking the location of the selected failed objects with the test data to determine a physical location of the selected failed objects on the integrated circuit.

9. The method of claim 8 wherein step b) comprises:
    constructing a set of polygons to enclose each object separately; and
    building a cross-reference map linking the polygons and the locations of the objects; and
    wherein step c) comprises:
    looking up locations of the polygons in the cross-reference map; and
    building a wafer map of the selected objects.

10. The method of claim 9 further comprising analyzing the wafer map to determine failure patterns.

11. The method of claim 9, wherein the wafer map is generated by plyview.

12. The method of claim 8 wherein the objects tested include phase locked loops.

13. The method of claim 8 wherein the objects tested include embedded arrays.

14. The method of claim 8 wherein the objects tested include at least one of a programmable logic array, a content addressable memory, a core, a macro or a scan chain.

15. The method of claim 8 wherein step b) further comprises determining a dimension of each object.

16. The method of claim 8 wherein step b) further comprises determining an orientation of each object.

17. The method of claim 8 wherein the location is obtained from physical layout design data.

18. The method of claim 8 further comprising displaying the location and shape of the selected objects on a wafer map.

19. The method of claim 8 further comprising providing a one to one correspondence between an object and one or more failing latches in the test data.

20. The method of claim 8, comprising:
physically plotting the location and shape of the failed objects on a visual map of the integrated circuit.

21. A method of illustrating test data comprising:
a) providing a wafer with objects located thereon;
b) testing the objects to create test data;
c) linking the test data with locations of the objects; and
d) building a map visually illustrating locations and shapes of selected failed objects which are chosen based on the test data, wherein the selected failed objects failed the test.

22. The method of claim 21 further comprising:
determining locations of each of the objects on the wafer;
constructing polygons to enclose each of the objects; and
building a cross-reference map to link the locations of each of the objects to the polygons; and
step d) comprises
referring to the cross-reference map to determine location of objects.

23. The method of claim 22 further comprising displaying the polygons of the selected objects on the map.

24. The method of claim 21 wherein the map indicates a physical location of the selected object on the wafer.

25. The method of claim 21 wherein the map indicates a physical location of the selected objects on an integrated circuit.

26. The method of claim 21, wherein step d) comprises:
physically plotting the location and shape of the failed objects on the map.

* * * * *